United States Patent
Fang et al.

(10) Patent No.: US 11,747,382 B2
(45) Date of Patent: Sep. 5, 2023

(54) TEST EQUIPMENT AND TEST DEVICE THEREOF

(71) Applicant: Siliconware Precision Industries Co., Ltd., Taichung (TW)

(72) Inventors: Bo-Siang Fang, Taichung (TW); Kuang-Sheng Wang, Taichung (TW); Hsinjou Lin, Taichung (TW); Shao-Meng Sim, Taichung (TW); Mao-Hua Yeh, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 16/723,233

(22) Filed: Dec. 20, 2019

(65) Prior Publication Data

US 2021/0123962 A1   Apr. 29, 2021

(30) Foreign Application Priority Data

Oct. 24, 2019   (TW) .................. 108138421

(51) Int. Cl.
  *G01R 29/10* (2006.01)
  *H04B 17/29* (2015.01)

(52) U.S. Cl.
  CPC .......... *G01R 29/105* (2013.01); *H04B 17/29* (2015.01)

(58) Field of Classification Search
  CPC .. G01R 29/105; G01R 31/2822; G01R 29/10; H04B 17/29; H04B 17/12
  See application file for complete search history.

(56) References Cited

U.S. PATENT DOCUMENTS

| | | | |
|---|---|---|---|
| 2002/0127971 A1* | 9/2002 | Chen | H04B 17/29 455/67.14 |
| 2009/0153158 A1* | 6/2009 | Dunn | G01R 31/2822 324/762.01 |
| 2013/0176047 A1* | 7/2013 | Peng | H01Q 13/085 324/750.26 |
| 2019/0068300 A1* | 2/2019 | Lu | G01R 31/2822 |

* cited by examiner

Primary Examiner — Yuwen Pan
Assistant Examiner — Fatuma G Sherif
(74) Attorney, Agent, or Firm — Hsuanyeh Law Group P.C.

(57) ABSTRACT

Testing equipment is used in an antenna testing process, and includes a testing head having a perforation, and a testing device having a cylinder. The cylinder is disposed in the perforation to act as a cavity for the antenna testing process. Therefore, only the cylinder needs to be replaced when the antenna testing process is performed on different devices under test, with the whole testing head intact.

11 Claims, 4 Drawing Sheets

TEST EQUIPMENT AND TEST DEVICE THEREOF

CROSS-REFERENCE TO RELATED APPLICATIONS

This application claims priority to Taiwan Application Serial No. 108138421, filed on Oct. 24, 2019. The entirety of the application is hereby incorporated by reference herein and made a part of this specification.

BACKGROUND

1. Technical Field

The present disclosure relates to testing equipment, and, more particularly, to testing equipment and a testing device thereof applied to an over the air (OTA) antenna testing process.

2. Description of the Prior Art

The fourth generation (4G) communication technique is used in the market currently. With the rapid development of wireless communication technique and ever increasing demand for a greater network resource flow, the fifth generation (5G) communication technique that provides broader bandwidth is brought to the market. In a 5G communication system, the object frequency band of the highest frequency is mm Wave, and ranges from 28 GHz to 52.6 GHz (3gpp R15), even up to 73 GHz.

A 4G antenna testing process is conducted at the system end, such as mobile phones, tablet computers etc., while a 5G antenna testing process is conducted at the packaging end since the mm Wave frequency band is changed to an antenna in package (AiP) design.

As shown in FIG. 1, testing equipment 1 according to the prior art comprises a circuit box 1a having a cavity 10 and an opening 100, a cover 11 disposed on the opening 100 and having a through hole 110, a testing socket 13 disposed on the cover 11, and a handler 12 connected to the testing socket 13. In the OTA testing process, a device under test 9 is placed on the testing socket 13, the handler 12 presses on the testing socket 13, and an antenna structure 90 of the device under test 9 is disposed toward a metal action board 10a disposed at the bottom of the cavity 10, and is entirely exposed without covered by any shield.

In the testing process of the testing equipment 1 according to the prior art, the circuit box 1a has to be replaced in order to meet the antenna structure 90 of a variety of semiconductor packages (e.g., QFN, LGA, SiP, FCBGA, FCCSP etc.). In other words, the circuit box 1a needs to be customized, and the testing equipment 1 thus has a high cost.

Therefore, how to provide testing equipment that can be applied to OTA testing environment and used to test the antenna of a variety of semiconductor packages is becoming an urgent issue in the art.

SUMMARY

In view of the drawbacks of the prior art, the present disclosure provides a testing device, comprising: a cylinder having a cavity and an opening in communication with the cavity; and a carrier cover having a circuit structure and disposed on the opening, the carrier cover being configured for covering the cavity.

In an embodiment, a wave absorbing material is disposed on an inner wall of the cylinder.

In an embodiment, the cylinder has a flat or inclined inner wall.

In an embodiment, the carrier cover has an action port corresponding to the opening. In another embodiment, the action port is a hole.

The present disclosure also provides testing equipment, comprising: a testing head having a first side, a second side opposing the first side, and a perforation in communication with the first side and the second side; and the above-described testing device, wherein the cylinder is disposed in the perforation, and the opening exposes from the first side of the testing head.

In an embodiment, the carrier cover is electrically connected to the testing head.

In an embodiment, the carrier cover is mounted on the testing head via a supporter. In another embodiment, the supporter is secured onto the testing head via a pad. In yet another embodiment, a slot is formed on an edge of the opening of the cylinder and secured to the pad.

In an embodiment, the testing equipment further includes a machine body for the testing head to be installed thereon. In another embodiment, the testing equipment further includes a testing socket electrically connected to the carrier cover for a device under test to be placed thereon, and a handler corresponding to the testing socket.

In the testing equipment and the testing device thereof according to the present disclosure, the cylinder of the testing device is detachably assembled in the perforation of the testing head to act as a cavity, in which an antenna testing process is conducted. Therefore, when different antenna structures are tested, only the cylinder needs to be replaced, with the testing device and/or testing head intact, thereby achieving modular replacement and cost savings. Compared with the prior art, the testing equipment according to the present disclosure can use a single testing head to test different antenna structures, without customizing the testing head. Accordingly, the cost of the testing equipment is reduced.

DETAILED DESCRIPTION

The following illustrative embodiments are provided to illustrate the present disclosure, these and other advantages and effects can be apparently understood by those in the art after reading the disclosure of this specification. The present disclosure can also be performed or applied by other different embodiments. The details of the specification may be on the basis of different points and applications, and numerous modifications and variations can be devised without departing from the spirit of the present disclosure.

The terminology used herein is for the purpose of describing particular devices and methods only and is not intended to be limiting of this disclosure. As used herein, the singular forms "a," "an," and "the" are intended to include the plural forms as well, unless the context clearly indicates otherwise.

It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

Figure 1:
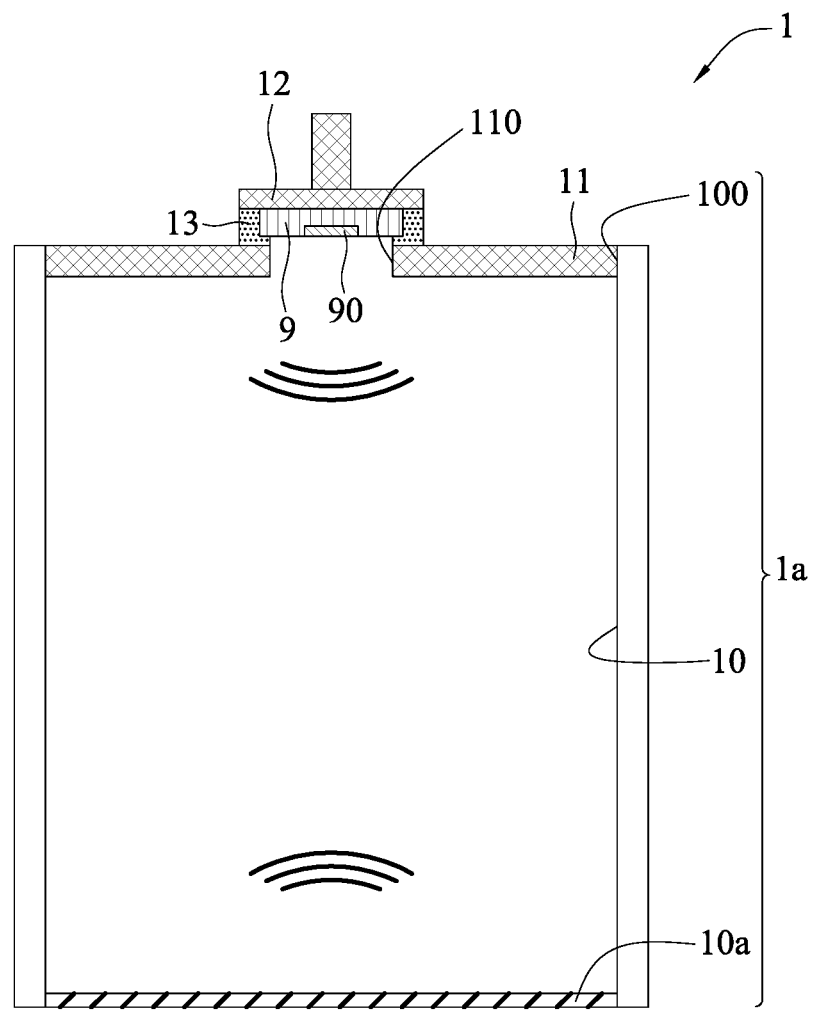
FIG. 1 is a side view of testing equipment according to the prior art.
Figure 2:
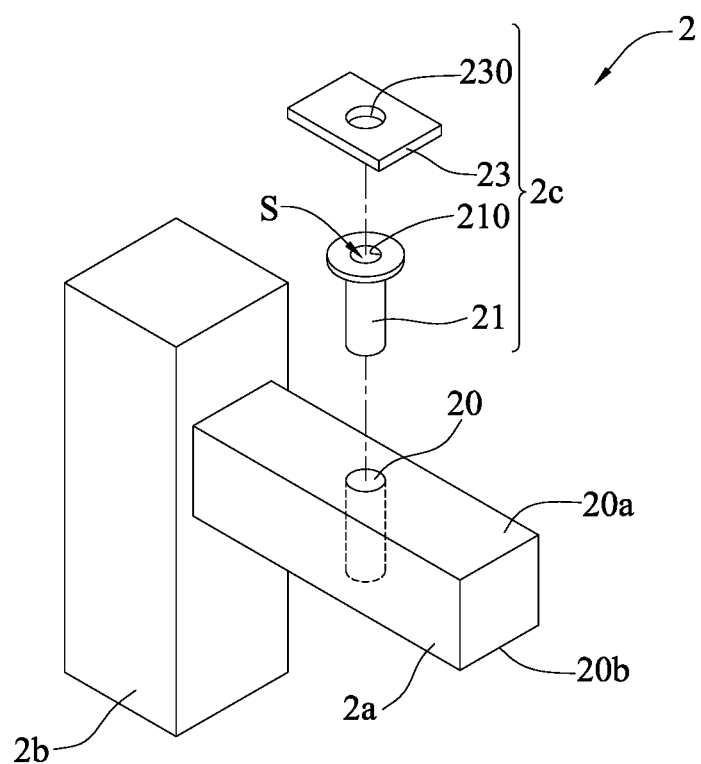
FIG. 2 is a perspective view of testing equipment according to the present disclosure.

FIG. 2 is a perspective view of testing equipment 2 according to the present disclosure. In an embodiment, the testing equipment 2 is used to test the operation of an antenna.

As shown in FIG. 2, the testing equipment 2 comprises a testing head 2a, a machine body 2b for the testing head 2a to be installed thereon, and a testing device 2c disposed on the testing head 2a.

The testing head 2a has a first side 20a, a second side 20b opposing the first side 20a, and a perforation 20 in communication with the first side 20a and the second side 20b.

In an embodiment, the testing head 2a is a circuit box and is equipped with a circuit needed for transmitting signals.

The machine body 2b is electrically connected to the testing head 2a and controls the testing head 2a to conduct an antenna testing process.

The testing device 2c comprises a cylinder 21 disposed in the perforation 20, and a carrier cover 23 electrically connected to the testing head 2a.

Figure 3:
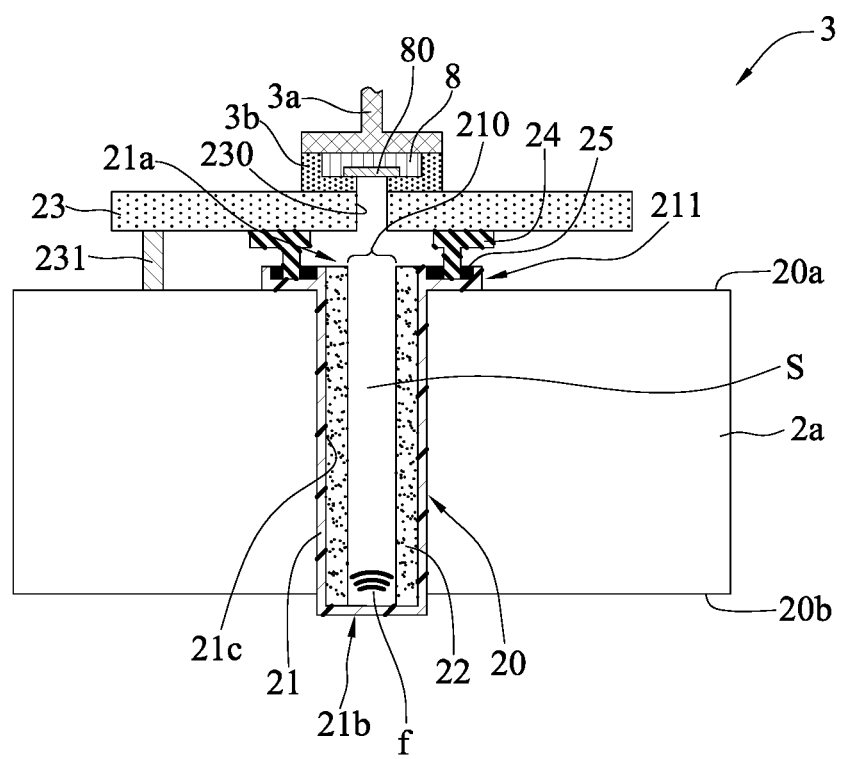
FIG. 3 is a side view of a portion of FIG. 2.
Figure 4A:
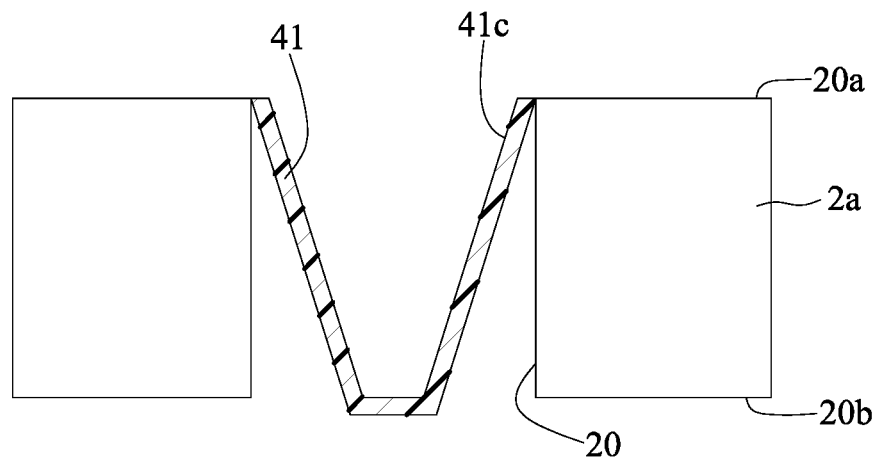
FIGS. 4A and 4B are side views of a portion of other embodiments of FIG. 2.
Figure 4B:
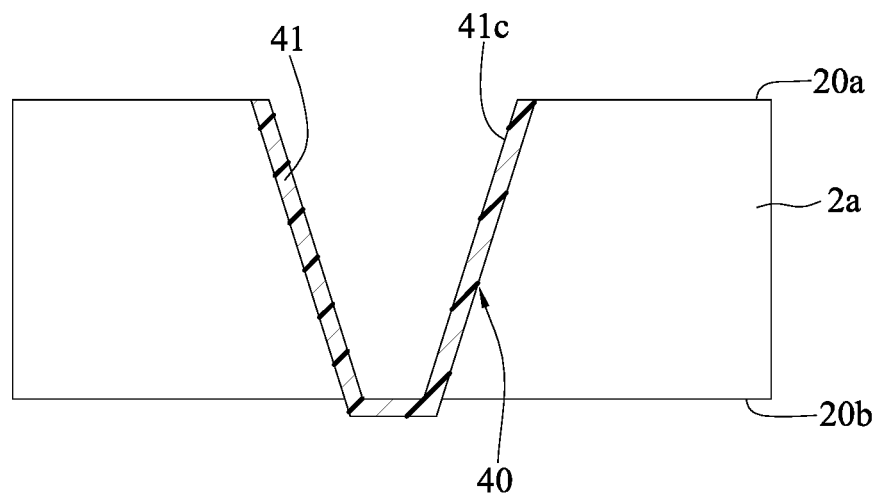

In an embodiment, the cylinder 21 is a straight cylinder, and has a cavity S and an opening 210 in communication with the cavity S, with the first side 20a of the testing head 2a exposed from the opening 210. As shown in FIG. 3, the opening 210 is formed on a first end 21a (a top end) of the cylinder 21, and a second end 21b (a bottom end) opposing the first end 21a of the cylinder 21 protrudes the second side 20b of the testing head 2a. In an embodiment, the cavity S is applied to an over the air (OTA) testing environment, and has a wall constituted by metal. The cylinder 21 has a straight, flat wall 21c, and a wave absorbing material 22 is disposed on the inner wall 21c of the cylinder 21 to filter out wireless signals in unneeded directions. As shown in FIG. 4A, the inner wall 41c of the cylinder 41 is inclined. As shown in FIG. 4B, the perforation 40 of the cylinder 41 and/or the testing head 2a is in the shape of a cone or a funnel.

The carrier cover 23 has a circuit structure, such as a circuit board, for carrying a device under test (DUT) 8 shown in FIG. 3, and is disposed on the opening 210 to cover the cavity S. The carrier cover 23 has an action port 230 corresponding to the opening 210, and the device under test 8 is disposed on the action port 230 correspondingly. In an embodiment, the device under test 8 is an in-car radar sensor and includes an electronic package of an antenna structure 80, and its semiconductor chip has a mm Wave function. In an embodiment, the action port 230 is a hole or other structures suitable for transmitting antenna signals, allowing the antenna structure 80 of the device under test 8 to generate an antenna action through the action port 230.

As shown in FIG. 3, the carrier cover 23 is mounted on the testing head 2a via a supporter 24. In an embodiment, a slot 211 is formed on an edge of the opening 210 of the cylinder 21 for securing (engaging) a block 25, and the supporter 24 is secured onto the first side 20a of the testing head 2a via the block 25. The carrier cover 23, the supporter 24 and the block 25 cover the cavity S. In an embodiment, the supporter 24 is a ring-shaped conductor, and is secured (e.g., screwed, adhered or welded) to a lower surface of the carrier cover 23. In another embodiment, the block 25 is a conductive pad.

The carrier cover 23 is electrically connected to the testing head 2a via at least one conductive element 231. In an embodiment, the conductive element 231 is a pin, a bump, a conductive pillar, a wire or other structures suitable for conducting electricity.

As shown in FIG. 3, the testing equipment 3 is equipped with a testing socket 3b electrically connected to the device under test 8, for the device under test 8 to be placed thereon, and a handler 3a corresponding to the testing socket 3b. In an embodiment, the testing socket 3b is electrically connected to the carrier cover 23. In another embodiment, the handler 3a is disposed on a robotic arm (not shown), for facilitating the automation of the antenna testing process.

When the testing equipment 2, 3 is in use, first the handler 3a is disposed away from the carrier cover 23, then the device under test 8 is placed on the testing socket 3b, and the testing socket 3b is disposed on the carrier cover 23, to allow the antenna structure 80 to correspond to and be in communication with the action port 230; then the handler 3a is pressed on the testing socket 3b to secure the testing socket 3b, allowing the testing socket 3b to be electrically connected to the carrier cover 23 reliably; and the machine body 2b controls and enables the testing head 2a to send commands to the carrier cover 23 to enable the carrier cover 23 to send signals via the testing socket 3b to the device under test 8 for conducting the subsequent antenna testing process.

When the antenna testing process is conducted, the antenna structure 80 of the device under test 8 senses reflection signals fat the bottom of the cavity S via the action port 230, the opening 210 and the cavity S, and the device under test 8 sends the reflection signals f sensed by the antenna structure 80 via the testing socket 3b, the carrier cover 23 and the testing head 2a to the machine body 2b.

In the testing equipment 2, 3 and the testing device 2c thereof according to the present disclosure, the cylinder 21 is detachably assembled (inserted) in the perforation 20 of the testing head 2a to act as a cavity, in which an antenna testing process is performed. Therefore, when different antenna structures 80 are tested, only the cylinder 21 needs to be replaced, with the testing device 2c and/or testing head 2a intact, thus achieving modular replacement and cost savings. Compared with the prior art, the testing equipment 2, 3 according to the present disclosure can use a testing head 2a of a single embodiment to test different antenna structures 80, without customizing the testing head 2a. Accordingly, the cost of the testing equipment 2, 3 is reduced.

According to the present disclosure, the wall 41c of the cylinder 41 is inclined, to facilitate the filtering out of wireless signals in unneeded directions, as shown in FIGS. 4A and 4B, to reduce the equipment cost.

The foregoing descriptions of the detailed embodiments are only illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:
1. A testing device, comprising:
a cylinder made of metal and having a cavity and an opening in communication with the cavity, wherein an end of the cylinder is a bottom of the cavity, the cavity is free from having an antenna, and an inner wall of the cylinder is inclined;

a wave absorbing material disposed on the inner wall of the cylinder, wherein the wave absorbing material is free from being in contact with a portion of the bottom of the cavity; and a carrier cover having a circuit structure and disposed on the opening for carrying a device under test, wherein the carrier cover is configured for covering the cavity, and the device under test senses reflection signals at the bottom of the cavity.

2. The testing device of claim 1, wherein the carrier cover has an action port corresponding to the opening.

3. The testing device of claim 2, wherein the action port is a hole.

4. Testing equipment, comprising:

a testing head having a first side, a second side opposing the first side, and a perforation in communication with the first side and the second side; and a testing device including:

a cylinder made of metal and having a cavity and an opening in communication with the cavity, wherein an end of the cylinder is a bottom of the cavity, and the cavity is free from having an antenna;

a wave absorbing material disposed on an inner wall of the cylinder, wherein the wave absorbing material is free from being formed on a in contact with a portion of the bottom of the cavity; and a carrier cover having a circuit structure and disposed on the opening for carrying a device under test, wherein the carrier cover is configured for covering the cavity, and the device under test senses reflection signals at the bottom of the cavity, wherein the cylinder is disposed in the perforation, and the opening exposes from the first side of the testing head.

5. The testing equipment of claim 4, wherein the carrier cover is electrically connected to the testing head.

6. The testing equipment of claim 4, further comprising a supporter, wherein the carrier cover is mounted on the testing head via the supporter.

7. The testing equipment of claim 6, further comprising a pad, wherein the supporter is secured onto the testing head via the pad.

8. The testing equipment of claim 7, further comprising a slot formed on an edge of the opening of the cylinder and secured to the pad.

9. The testing equipment of claim 4, further comprising a testing socket electrically connected to the carrier cover for the device under test to be placed thereon.

10. The testing equipment of claim 9, further comprising a handler corresponding to the testing socket.

11. The testing equipment of claim 4, further comprising a machine body for the testing head to be installed thereon.

* * * * *